(12) United States Patent
Jeong

(10) Patent No.: US 11,331,979 B2
(45) Date of Patent: May 17, 2022

(54) COOLING SYSTEM FOR ECO-FRIENDLY VEHICLE

(71) Applicants: Hyundai Motor Company, Seoul (KR); Kia Motors Corporation, Seoul (KR)

(72) Inventor: Yeon Man Jeong, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/424,002

(22) Filed: May 28, 2019

(65) Prior Publication Data

US 2020/0180393 A1 Jun. 11, 2020

(30) Foreign Application Priority Data

Dec. 6, 2018 (KR) .......................... 10-2018-0155760

(51) Int. Cl.
 *H05K 7/20* (2006.01)
 *B60H 1/00* (2006.01)
 (Continued)

(52) U.S. Cl.
 CPC ............ *B60H 1/00278* (2013.01); *B60L 1/02* (2013.01); *B60L 58/26* (2019.02); *H01M 10/613* (2015.04); *H01M 10/625* (2015.04); *H01M 10/6563* (2015.04); *H01M 10/663* (2015.04); *H02K 9/04* (2013.01); *H02K 9/19* (2013.01); *H05K 7/20145* (2013.01); *H05K 7/20172* (2013.01); *H05K 7/20254* (2013.01); *H05K 7/20272* (2013.01); *H05K 7/20863* (2013.01);
 (Continued)

(58) Field of Classification Search
 CPC ............ B60H 1/00278; H01M 10/613; H01M 10/625; H01M 10/6563; H01M 10/663; H01M 2220/20; B60L 58/26; B60L 1/02; H02K 9/04; H02K 9/19; H05K 7/20145; H05K 7/20172; H05K 7/20254; H05K 7/20272; H05K 7/20281; H05K 7/20863; H05K 7/20872; H05K 7/20909; H05K 7/20927; H05K 7/20945
 USPC ........................................................ 361/699
 See application file for complete search history.

(56) References Cited

U.S. PATENT DOCUMENTS 4,415,847 A * 11/1983 Galloway ........... H01M 10/365
 320/150
6,329,723 B1 * 12/2001 Hilpert ...................... B60L 9/00
 123/41.12
(Continued)

FOREIGN PATENT DOCUMENTS

KR 10-2012-0055414 A 5/2012
KR 2016-0046262 A 4/2016

OTHER PUBLICATIONS

KR 10-2016-0046262—English Machine Translation (Year: 2016).*

*Primary Examiner* — Anatoly Vortman
(74) *Attorney, Agent, or Firm* — Mintz Levin Cohn Ferris Glovsky and Popeo, P.C.; Peter F. Corless

(57) ABSTRACT

A cooling system for an eco-friendly vehicle is provided. The system includes an electronic component cooling device that cools an electronic component of an eco-friendly vehicle and a battery cooling device that cools a battery installed within the eco-friendly vehicle. A connector connects the electronic component cooling device and the battery cooling device with each other.

7 Claims, 2 Drawing Sheets

(51) Int. Cl.
*H02K 9/04* (2006.01)
*H02K 9/19* (2006.01)
*B60L 58/26* (2019.01)
*H01M 10/663* (2014.01)
*H01M 10/613* (2014.01)
*H01M 10/625* (2014.01)
*H01M 10/6563* (2014.01)
*B60L 1/02* (2006.01)

(52) U.S. Cl.
CPC ..... *H05K 7/20872* (2013.01); *H05K 7/20909* (2013.01); *H05K 7/20927* (2013.01); *H05K 7/20945* (2013.01); *H01M 2220/20* (2013.01)

(56) References Cited

U.S. PATENT DOCUMENTS

| | | | | |
|---|---|---|---|---|
| 6,394,210 B2* | 5/2002 | Matsuda | ............ | B60H 1/00278 180/68.1 |
| 6,481,230 B2* | 11/2002 | Kimishima | ............ | B60H 1/323 62/239 |
| 7,451,808 B2* | 11/2008 | Busse | ................ | B60H 1/00278 165/202 |
| 9,533,551 B2* | 1/2017 | Cheng | ................ | B60H 1/00278 |
| 9,680,190 B1* | 6/2017 | Xia | .................... | H01M 10/615 |
| 9,810,137 B2* | 11/2017 | Presetschnik | ............. | F01P 3/20 |
| 9,826,666 B2* | 11/2017 | France | .................... | H01L 23/427 |
| 9,827,846 B2* | 11/2017 | Porras | .................... | B60K 11/04 |
| 9,947,975 B2* | 4/2018 | Porras | ................. | H01M 10/617 |
| 10,166,835 B2* | 1/2019 | Kim | .................... | B60H 1/00385 |
| 10,486,493 B2* | 11/2019 | Kim | .................... | B60H 1/32284 |
| 2008/0053385 A1* | 3/2008 | Negoro | ................. | F01P 11/0285 123/41.31 |
| 2010/0050960 A1* | 3/2010 | Araki | ...................... | F01P 7/165 123/41.1 |
| 2011/0132017 A1* | 6/2011 | Kim | .................. | H01M 8/04029 62/259.2 |
| 2012/0205088 A1* | 8/2012 | Morisita | ............... | B60L 3/0061 165/202 |
| 2016/0084144 A1* | 3/2016 | Kim | ....................... | F01P 7/167 123/41.08 |
| 2017/0158081 A1 | 6/2017 | Kim et al. | | |
| 2018/0111443 A1* | 4/2018 | Kim | ..................... | B60H 1/00385 |
| 2018/0117985 A1 | 5/2018 | Kim et al. | | |
| 2018/0117986 A1 | 5/2018 | Kim et al. | | |
| 2018/0117990 A1* | 5/2018 | Kim | ..................... | B60H 1/00278 |
| 2018/0117991 A1* | 5/2018 | Kim | ..................... | B60H 1/143 |
| 2018/0154734 A1* | 6/2018 | Lee | ....................... | B60H 1/00328 |
| 2019/0047369 A1* | 2/2019 | Kim | ..................... | F25B 25/005 |
| 2019/0176563 A1* | 6/2019 | Kim | ..................... | B60H 1/004 |
| 2019/0176572 A1* | 6/2019 | Kim | ..................... | B60H 1/00885 |
| 2019/0381857 A1* | 12/2019 | Lee | ..................... | H01M 2/1072 |

* cited by examiner

COOLING SYSTEM FOR ECO-FRIENDLY VEHICLE

CROSS REFERENCE TO RELATED APPLICATION

The present application claims priority to Korean Patent Application No. 10-2018-0155760, filed on Dec. 6, 2018, the entire contents of which is incorporated herein for all purposes by this reference.

BACKGROUND

1. Technical Field

The present disclosure relates to a cooling system for an eco-friendly vehicle, and more particularly, to a cooling system for an eco-friendly vehicle that effectively cools an electronic component cooling device for cooling an electronic component of an eco-friendly vehicle and a battery cooling device that cools a battery installed within the eco-friendly vehicle, using only one reservoir tank.

2. Description of the Related Art

Recently, as interest in energy efficiency and the problem of environmental pollution has increased, there has been a need to develop an eco-friendly vehicle that is capable of replacing an internal combustion engine vehicle. Such an eco-friendly vehicle is generally classified into an electric vehicle that is driven using a fuel cell or electricity as a power source, or a hybrid vehicle that is driven using an engine and a battery. The hybrid vehicle generates driving force by driving a motor using electricity supplied from a fuel cell or an electric battery as well as an engine that is operated using general fuel. In this case, heat generated from electronic components including a fuel cell or a battery, a motor, and the like should be removed to enhance vehicle safety and efficiency.

Accordingly, in a conventional hybrid vehicle or electric vehicle, an electronic component cooling device and a battery cooling device are configured as separate closed circuits, respectively, and cool heat generated from a motor, an electronic component, and a battery, to cool the heat generated from the motor, the electronic component, and the battery, as shown in FIG. 1. However, conventionally, the electronic component cooling device and the battery cooling device are configured separately, and thus, a reservoir tank for an electronic component cooling device and a reservoir tank for a battery cooling device need to be configured separately. Accordingly, a layout of cooling pipes is complex, and the size and weight of the entire cooling system is increased.

SUMMARY

An object of the present disclosure is to provide a cooling system for an eco-friendly vehicle that includes only one of reservoir tanks for an electronic component cooling device and a battery cooling device, supplies a coolant to a battery cooling device from the reservoir tank, and allows coolants of the electronic component cooling device and the battery cooling device to independently circulate to cool each of the electronic component and the battery after the coolant is filled in the battery cooling device, and thus, a layout of cooling pipes may be simplified, and the size and weight of an entire cooling system may be reduced.

According to an exemplary embodiment of the present disclosure, a cooling system for an eco-friendly vehicle may include an electronic component cooling device configured to cool an electronic component of an eco-friendly vehicle, a battery cooling device configured to cool a battery installed in the eco-friendly vehicle, and a connector configured to connect the electronic component cooling device and the battery cooling device with each other.

The electronic component of the eco-friendly vehicle may include an inverter and a motor. The electronic component cooling device may include the electronic component of the eco-friendly vehicle, a heat exchanger configured to cool a coolant that flows in the electronic component cooling device, a first pump configured to allow the coolant to circulate in the electronic component cooling device, a reservoir tank into which the coolant may be injected to be stored, and an electronic component cooling pipe that connects the heat exchanger, the first pump, and the reservoir tank with each other, and through which the coolant may be flow.

The cooling system may further include a cooling fan installed behind the heat exchanger and configured to facilitate cooling of the electronic component cooling device. Additionally, the cooling system may include an air conditioner device installed in front of the heat exchanger and configured to facilitate cooling of the electronic component cooling device and a temperature sensor installed in the electronic component cooling device and configured to measure a temperature of the coolant. The connector may connect the reservoir tank and the battery cooling pipe.

The battery cooling device may include a second pump configured to supply a coolant injected into the reservoir tank to the battery cooling device, a battery configured to supply energy for driving the vehicle, a jiggle valve connected to the reservoir tank, disposed in front of an inlet of the battery, configured to block introduction of air into the battery, and configured to discharge the air to the reservoir tank, a battery cooing pipe that connects the second pump, the battery, and the jiggle valve, and through which coolant may flow, and a chiller disposed in front of the battery and configured to cool a coolant of the battery cooling pipe.

The cooling system may further include an air pipe that connects the jiggle valve and the reservoir tank with each other. Air introduced into the battery or air generated from the battery cooling pipe may flow to the reservoir tank along the air pipe through the jiggle valve. The cooling system may further include a controller configured to determine whether a coolant is injected into the reservoir tank, and to operate the first pump, the second pump, the cooling fan, and the jiggle valve. The controller may be configured to operate the second pump to supply a coolant of the reservoir tank to a battery cooling pipe of the battery cooling device.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, a cooling system for an eco-friendly vehicle according to exemplary embodiments of the present disclosure is described with reference to the accompanying drawings.

Figure 1:
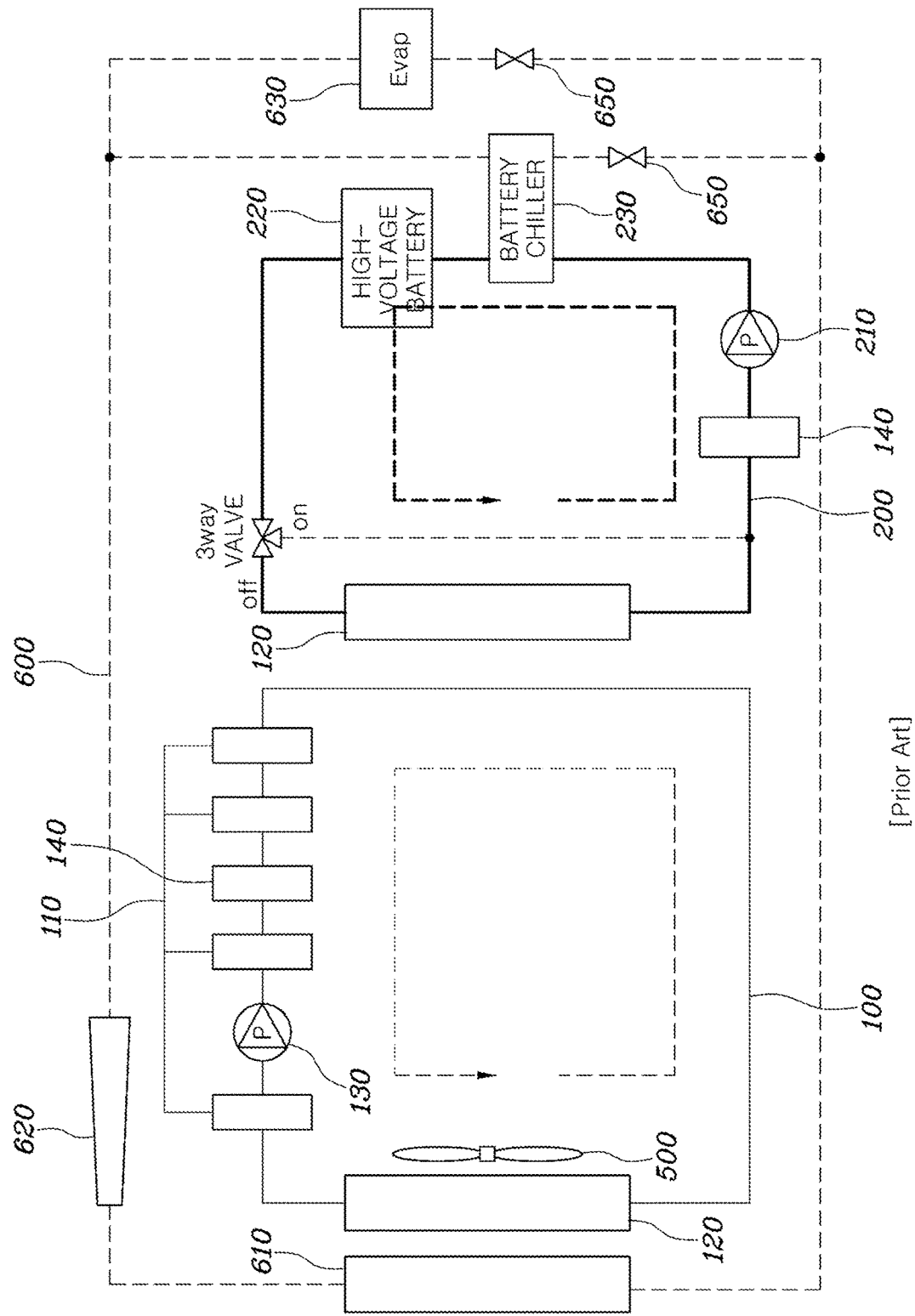
FIG. 1 is a diagram showing the configuration of a conventional cooling system for an eco-friendly vehicle according to the related art.
Figure 2:
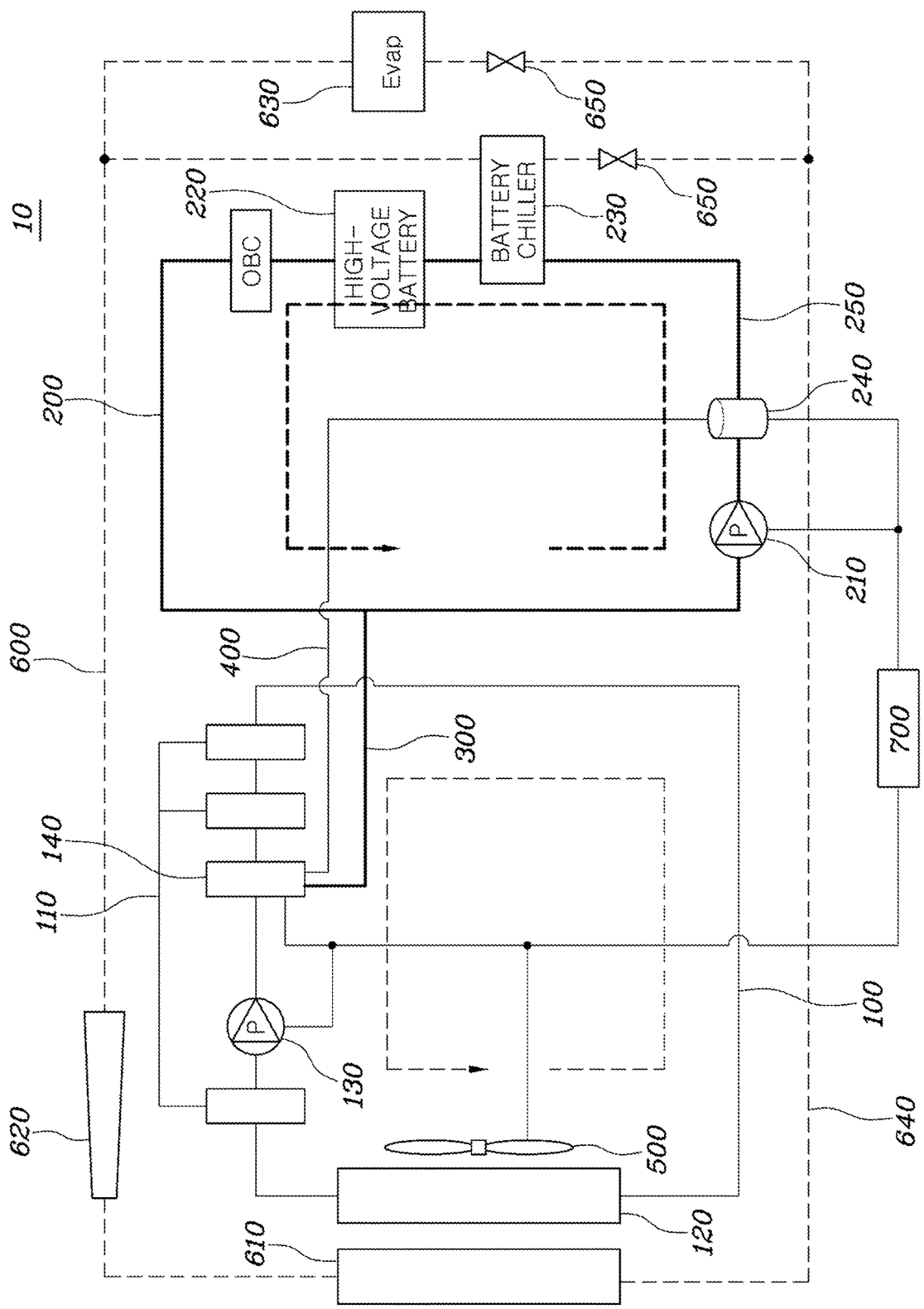
FIG. 2 is a diagram showing the configuration of a cooling system for an eco-friendly vehicle according to an exemplary embodiment of the present disclosure.

FIG. 2 is a diagram showing the configuration of a cooling system for an eco-friendly vehicle according to an exemplary embodiment of the present disclosure. As shown in FIG. 2, an eco-friendly vehicle cooling system 10 according to an exemplary embodiment of the present disclosure may include an electronic component cooling device 100 configured to cool an electronic component for an eco-friendly vehicle, a battery cooling device 200 configured to cool a battery installed in the eco-friendly vehicle, and a connector 300 that connects the electronic component cooling device 100 and the battery cooling device 200. In particular, the eco-friendly vehicle cooling system 10 according to an exemplary embodiment of the present disclosure may be applied to a hybrid vehicle using both an engine and a motor or an electric vehicle.

Accordingly, in a cooling system for an eco-friendly vehicle according to the present disclosure, the electronic component cooling device 100 and the battery cooling device 200 may be connected to each other via the connector 300 to supply a coolant to the battery cooling device 200 from a reservoir tank of the electronic component cooling device 100. Coolants of the electronic component cooling device 100 and the battery cooling device 200 may circulate independently from each other after a coolant is filled in the battery cooling device 200 to cool each of an electronic component and a battery. Thus, a layout of cooling pipes may be simplified, and the size and weight of an entire cooling system may be reduced.

In particular, the electronic component cooling device 100 may include an electronic component 110 of an eco-friendly vehicle, a heat exchanger 120, a first pump 130, a reservoir tank 140, and an electronic component cooling pipe 150. The electronic component 110 of an eco-friendly vehicle may be an electronic component that generates heat as the eco-friendly vehicle is driven, and in some exemplary embodiments, may include a motor and an inverter, which are required to drive the eco-friendly vehicle. In addition, various electronic components requiring cooling due to heat generated therefrom as the eco-friendly vehicle is driven may be included in the electronic component according to the present disclosure. For example, the electronic component 110 may include a hybrid starter generator (HSG), a hybrid power control unit (HPCU), an oil pump unit (OPU), and the like.

The heat exchanger 120 may be disposed in a front area of a vehicle and may be configured cool a coolant that circulates in the electronic component cooling pipe 150. In some exemplary embodiments, the heat exchanger 120 may be a radiator. In particular, the heat exchanger 120 may be configured to cool a coolant that circulates and is introduced through the electronic component cooling pipe 150 via heat exchange with air introduced as a vehicle is driven.

The first pump 130 may be configured to circulate a coolant in the electronic component cooling device 100. According to the present disclosure, the first pump 130 may be an electric water pump (EWP). In particular, the first pump 130 may be configured to circulate a coolant cooled in the heat exchanger 120 along the electronic component cooling pipe 150 to cool the electronic component 110 including a motor and an inverter to prevent the electronic component 110 from being heated excessively.

The reservoir tank 140 may store a coolant injected thereinto, and the injected coolant may be supplied to the battery cooling device 200 through the connector 300. In particular, the coolant injected into the reservoir tank 140 may be supplied to a battery cooling pipe 250 of the battery cooling device 200 after the battery cooling pipe 250 enters in a vacuum state, and a second pump 210 of the battery cooling device 200 may be driven to forcibly supply the coolant injected into the reservoir tank 140 to the battery cooling pipe 250. The electronic component cooling pipe 150 may connect the heat exchanger 120, the first pump 130, and the reservoir tank 140, and a coolant in the electronic component cooling pipe 150 may flow and circulate through the first pump 130.

The cooling system may further include a cooling fan 500 installed behind the heat exchanger 120 to facilitate cooling of the electronic component cooling device 100, and a temperature sensor 160 installed in the electronic component cooling device 100 and configured to measure a temperature of a coolant of the electronic component cooling pipe 150. Particularly, information regarding the temperature of the coolant measured by the temperature sensor 160 may be transmitted to a controller 700 to be described below. The controller 700 may be configured to operate the cooling fan 500 and facilitate heat exchange with air introduced from the outside to increase the cooling efficiency of the coolant when the temperature measured by the temperature sensor 160 is equal to or greater than a preset temperature (e.g., about 20 C).

Further, the controller 700 may be configured to operate the cooling fan 500 and facilitate cooling of the electronic component cooling device 100 only when the coolant is at the preset temperature or greater. Accordingly, a waste of electricity due to operation of the cooling fan 500 may be minimized. The battery cooling device 200 may be configured to cool a battery installed within a vehicle. In particular, the battery cooling device 200 may include the second pump 210, a battery 220, a jiggle valve 240, the battery cooling pipe 250, and a chiller 230.

The second pump 210 may be configured to supply a coolant injected into the reservoir tank 140 to the battery cooling pipe 250 of the battery cooling device 200. According to the present disclosure, the second pump 210 may be an electric water pump (EWP). In particular, the second pump 210 may be configured to circulate a coolant cooled through the chiller 230 along the battery cooling pipe 250 to cool a battery, thereby preventing the battery 220 from being heated excessively. The battery 220 may be configured to supply energy for driving an eco-friendly vehicle. According to the present disclosure, the battery 220 may be a high-voltage battery that drives a motor installed within an eco-friendly vehicle and provides energy required to drive a vehicle.

The jiggle valve 240 may be connected to the reservoir tank 140, may be disposed in front of an inlet of the battery 220 to block introduction of air into the battery 220, and may be configured to discharge air in a coolant included in the battery cooling pipe 250 to the reservoir tank 140. In the battery cooling device 200, air, bubbles, etc. may be generated when a coolant circulates along the battery cooling pipe 250 through the second pump 210, and the air, bubbles, etc. may hinder a flow of the coolant circulating in the battery cooling pipe 250. In other words, the coolant may not smoothly circulate due to air, bubbles, etc. in the battery cooling pipe 250, and as a result, a battery may not be cooled effectively. Accordingly, according to the present disclosure, the jiggle valve 240 may be installed in front of the inlet of the battery 220, and thus, may prevent air from being introduced into the battery cooling pipe 250 for cooling the battery 220, and may allow a coolant to smoothly circulate in a battery cooling pipe, thereby effectively cooling the battery.

The battery cooling pipe 250 may connect the second pump 210, the battery 220, and the jiggle valve 240, and a coolant in the battery cooling pipe 250 may flow and circulate through the second pump 210. The chiller 230 may be disposed in front of the battery 220 to cool a coolant of the battery cooling pipe 250. In particular, the chiller 230 may be configured to maintain low temperature using a refrigerant that circulates in a refrigerant pipe 640 of an air conditioner device 600 to be described below, and may be configured to cool a coolant that circulates in the battery cooling pipe 250 via heat exchange with the coolant to cool the battery 220 using the cooled coolant.

As shown in FIG. 2, the cooling system for an eco-friendly vehicle according to an exemplary embodiment of the present disclosure may further include the air conditioner device 600. The air conditioner device 600 may be connected to a condenser 610 via the refrigerant pipe 640 and may include a valve 650 for expending (e.g., exhausting) a refrigerant discharged from the condenser 610, an evaporator 630 connected to the valve 650 via the refrigerant pipe 640 and configured to evaporate the refrigerant expended from the valve 650, and a compressor 620 connected to the evaporator 630 via the refrigerant pipe 640 and configured to compress the refrigerant discharged from the evaporator 630 and to supply the refrigerant to the condenser 610. In particular, the condenser 610 may be installed in front of the heat exchanger 120 of the electronic component cooling device 100, and may assist the heat exchanger 120 to facilitate cooling of a coolant that circulates in the electronic component cooling device 100. The air conditioner device according to the present disclosure is already known technologies, and thus, a detailed component of components of the air conditioner device is omitted.

The connector 300 may connect the reservoir tank 140 of the electronic component cooling device 100 and the battery cooling pipe 250 with each other. According to the present disclosure, the reservoir tank 140 and the battery cooling pipe 250 may be connected via the connector 300, and a coolant injected into the reservoir tank 140 may be supplied to the battery cooling pipe 250 through the connector 300. In addition, after a coolant is filled in the battery cooling pipe 250, coolants of the electronic component cooling device 100 and the battery cooling device 200 may circulate independently from each other to cool an electronic component and a battery. Thus, a layout of cooling pipes may be simplified, and the size and weight of an entire cooling system may be reduced.

The cooling system for an eco-friendly vehicle according to the present disclosure may further include an air pipe 400 for connection of the jiggle valve 240 of the battery cooling device 200 and the reservoir tank 140. In particular, the jiggle valve 240 may be configured to transport or guide air introduced into the battery 220 or air generated from the battery cooling pipe 250 to the reservoir tank 140 through the air pipe 400.

According to the present disclosure, the cooling system for an eco-friendly vehicle may further include the controller 700 configured to determine whether a preset amount of a coolant is injected into the reservoir tank 140, and to operate the first pump 130, the second pump 210, the cooling fan 500, and the jiggle valve 240. Particularly, in some exemplary embodiments, the controller 700 may be configured to determine whether a preset amount of a coolant is injected into the reservoir tank 140 using a level sensor or the like, which is installed in the reservoir tank 140. When a coolant is injected into the reservoir tank 140, the controller 700 may be configured to operate the second pump 210 to supply a coolant of the reservoir tank 140 to the battery cooling pipe 250.

As described above, according to the present disclosure, the cooling system for an eco-friendly vehicle may include only one of reservoir tanks for an electronic component cooling device and a battery cooling device, may be configured to supply a coolant to a battery cooling device from the reservoir tank, and allow coolants of the electronic component cooling device and the battery cooling device to circulate independently to cool each of the electronic component and the battery after the coolant is filled in the battery cooling device. Accordingly, a layout of cooling pipes may be simplified, and the size and weight of an entire cooling system may be reduced.

Although the present disclosure has been shown and described with respect to specific embodiments, it will be apparent to those having ordinary skill in the art that the present disclosure may be variously modified and altered without departing from the spirit and scope of the present disclosure as defined by the following claims.

What is claimed is:

1. A cooling system for an eco-friendly vehicle, comprising:
   a first cooling device configured to cool an electronic component of an eco-friendly vehicle;
   a second cooling device configured to cool a battery installed within the eco-friendly vehicle;
   a connector that connects the first cooling device and the second cooling device; and
   a controller:
   wherein the first cooling device includes:
   a reservoir tank into which a coolant is injected and in which the coolant is stored;
   a first heat exchanger configured to cool a coolant flowing in the first cooling device;
   a first pump configured to circulate the coolant in the first cooling device;
   a first cooling pipe that connects the first heat exchanger, the first pump, and the reservoir tank and through which the coolant flows; and
   an air pipe configured to transport air generated from a second cooling pipe of the second cooling device to the reservoir rank,
   wherein the connector connects the reservoir tank and the second cooling pipe and is configured to supply a coolant to the second cooling device from the reservoir tank.

2. The cooling system of claim 1, wherein the electronic component of the eco-friendly vehicle includes an inverter and a motor.

3. The cooling system of claim 1, further comprising:
   a cooling fan installed behind the first heat exchanger and configured to facilitate cooling of the first cooling device.

4. The cooling system of claim 1, further comprising:
   an air conditioner device installed in front of the first heat exchanger and configured to facilitate cooling of the first cooling device.

5. The cooling system of claim 1, further comprising:
   a temperature sensor installed in the first cooling device and configured to measure a temperature of the coolant.

6. The cooling system of claim 1, wherein the second cooling device includes:
   a second pump configured to supply the coolant injected into the reservoir tank to the second cooling device;
   a jiggle valve connected to the reservoir tank, disposed in front of an inlet of the battery, configured to block introduction of air into the battery, and to discharge the air to the reservoir tank;
   a second cooling pipe that connects the second pump, the battery, and the jiggle valve, and through which the coolant flows; and
   a second heat exchanger disposed in front of the battery and configured to cool a coolant of the second cooling pipe, and
   wherein the controller is configured to operate the second pump to supply the coolant of the reservoir tank to the second cooling pipe of the second cooling device.

7. A cooling system for an eco-friendly vehicle, comprising:
   a first cooling device configured to cool an electronic component of an eco-friendly vehicle;
   a second cooling device configured to cool a battery installed within the eco-friendly vehicle;
   a connector that connects the first cooling device and the second cooling device; and
   a controller:
   wherein the first cooling device includes:
   a reservoir tank into which a coolant is injected and in which the coolant is stored;
   a first heat exchanger configured to cool a coolant flowing in the first cooling device;
   a first pump configured to circulate the coolant in the first cooling device;
   a first cooling pipe that connects the first heat exchanger, the first pump, and the reservoir tank and through which the coolant flows; and
   an air pipe configured to transport air generated from a second cooling pipe of the second cooling device to the reservoir tank, wherein the connector connects the reservoir tank and the second cooling pipe and is configured to supply a coolant to the second cooling device from the reservoir tank,
   wherein a connection part at which the air pipe is connected to the second cooling pipe is located downstream a connection part at which the connector is connected to the second cooling pipe and upstream the second heat exchanger in the second cooling pipe.

\* \* \* \* \*